United States Patent [19]

Jo et al.

[11] Patent Number: 4,582,383
[45] Date of Patent: Apr. 15, 1986

[54] TERMINAL APPARATUS AND A BATCH INSERTING TYPE TEST PLUG FOR A DRAWER TYPE RELAY

[75] Inventors: Toshitaka Jo; Kuniyoshi Hara; Koichi Mizuta; Hiroshi Yamamoto, all of Hyogo, Japan

[73] Assignee: Mitsubishi Denki Kabushiki Kaisha, Tokyo, Japan

[21] Appl. No.: 562,569

[22] Filed: Dec. 19, 1983

Related U.S. Application Data

[62] Division of Ser. No. 403,388, Jul. 30, 1982, Pat. No. 4,476,400.

[30] Foreign Application Priority Data

Jul. 30, 1981 [JP] Japan .................. 56-119812
Oct. 1, 1981 [JP] Japan .................. 56-156753

[51] Int. Cl.⁴ .................. H01R 13/00; H01R 13/514; H01R 21/22; H01R 9/00
[52] U.S. Cl. .................. 339/108 TP; 339/18 R; 339/19; 339/113 R; 339/157 R; 339/176 P; 339/198 G; 339/218 M
[58] Field of Search ............... 339/17 R, 17 E, 176 M, 339/198 P, 218 R, 218 M, 113 R, 113 B, 108 TP, 147 P, 18 C, 18 P, 19, 272 R, 272 A, 176 R, 176 P, 176 MF, 157 R, 156 R, 150 B, 151 B, 198 G

[56] References Cited

U.S. PATENT DOCUMENTS

| | | | |
|---|---|---|---|
| 1,718,529 | 6/1929 | Coldwell | 339/157 R X |
| 3,692,966 | 9/1972 | Lancaster | 339/17 LM X |
| 3,737,833 | 6/1973 | Jerominek | 339/176 MF X |
| 3,884,544 | 5/1975 | Lundergan et al. | 339/198 G |
| 3,930,706 | 1/1976 | Obuch et al. | 339/272 R X |

FOREIGN PATENT DOCUMENTS

| | | |
|---|---|---|
| 827512 | 1/1952 | Fed. Rep. of Germany ... 339/157 R |
| 52-15783 | 5/1977 | Japan . |

OTHER PUBLICATIONS

Relay Test System Combitest (catalogue RK 92-11E) Jul. 3, 1975.
Draw-Out Relay-Case Series 2, Pamphlet 1359, pp. 7-9.
XRT Type Test Plug, Toshiba, KSA 61126, 1975.
TP Type Test Plug, Hitachi ER-231, p. 144.

*Primary Examiner*—Gil Weidenfeld
*Assistant Examiner*—Steven C. Bishop
*Attorney, Agent, or Firm*—Sughrue, Mion, Zinn, Macpeak and Seas

[57] ABSTRACT

A terminal apparatus and a batch inserting type test plug for a horizontal type case drawer protective relay allows for easy measuring and testing of a plurality of poles. The terminal apparatus has an inspection window on a front surface of upper and lower terminal boards which allows visual observation of a short bar, a stopping board, and a triangular contact on an end of a contact piece in the terminal apparatus which allows one to visually inspect a short-circuit state of a current transformer secondary side of the terminal apparatus. The test plug has a plurality of electrode plates with conduction plates thereon, the electrode plates being arranged in a line so that a width line of the electrode plates interconnecting the conduction plates is perpendicular to the line of the electrode plates so that a length of the test plug handle is compact. Also, a plurality of terminal knobs are arranged in a zigzag pattern so that an arrangement order of the electrode plates can easily be determined visually.

9 Claims, 11 Drawing Figures

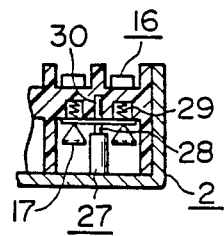
FIG. 5
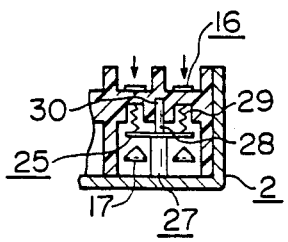
FIG. 6
FIG. 7
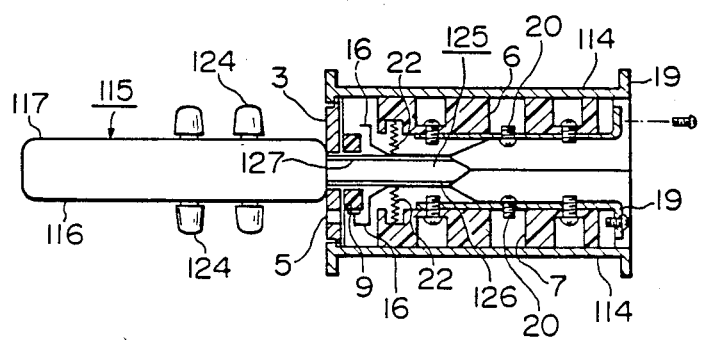
FIG. 8
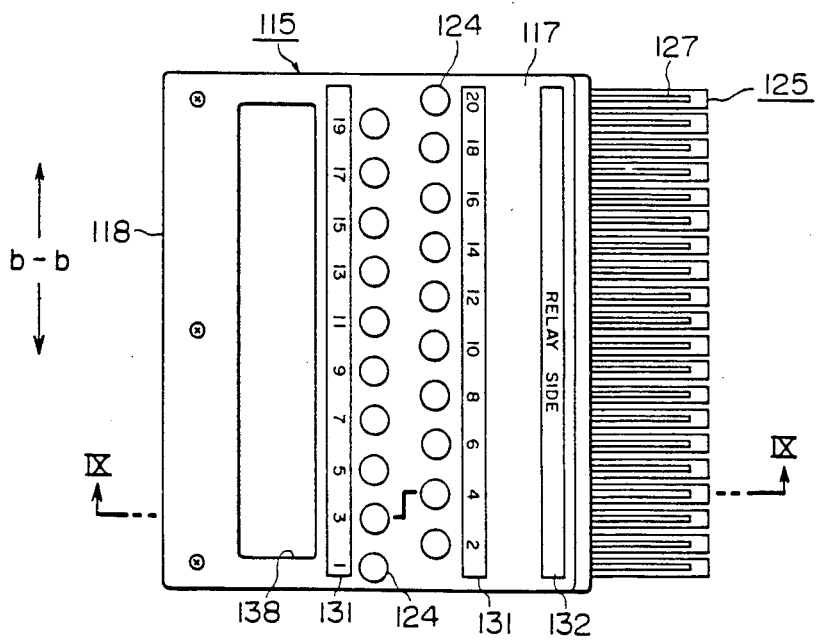

TERMINAL APPARATUS AND A BATCH INSERTING TYPE TEST PLUG FOR A DRAWER TYPE RELAY

This application is a division of copending application Ser. No. 403,388 filed July 30, 1982, now U.S. Pat. No. 4,476,400.

BACKGROUND OF THE INVENTION

1. Field of the Invention

The present invention relates to an improved terminal apparatus for a horizontal type case drawer relay having an improved contact mechanism for preventing a secondary side of a current transformer (hereinafter referred to as "CT") from opening, and also relates to an improved batch inserting type test plug used for the measuring and testing of internal elements of such a relay.

2. Description of the Prior Art

In general, a drawer type relay case can be either a vertical type case which is long in a vertical direction, or a horizontal type case which is long in a horizontal direction.

The horizontal type case drawer relay has been developed only recently and uses print cards so that the relay becomes stationary. In order to improve heat radiation and enable arrangement of many pieces, a plurality of print cards which extend in a vertical direction are arranged side by side and enclosed within the case. The case is long in the horizontal direction and is attached to a switchboard as a horizontal type case.

The vertical type case drawer type relay is a relay box which contains mainly mechanical elements, and a terminal apparatus is arranged on a lower or an upper portion of the relay. The case is long in the vertical direction and is attached to the switchboard vertically as an embedding type.

Relay elements in the horizontal type case can be made compact in comparison with those in a vertical type case. A plurality of relay elements, which are arranged side by side, can be enclosed in one case; therefore, the horizontal type case has advantages in that the occupied area in the switchboard can be significantly reduced. Accordingly, the horizontal type case is conveniently used in large-scale protective relay apparatuses.

A terminal apparatus with a batch inserting type test plug, which is installed in a vertical type case, allows for easy measuring and testing. However, when the test plug is required to accommodate multiple poles, the terminal apparatus becomes excessively large. It is also difficult to enclose such a test plug in a horizontal type case relay which has a compact configuration; therefore, such a test plug is not used for testing and measuring in a horizontal type case relay. In place of such a test plug, a rear connector is installed to perform the required measuring and testing.

The rear connector is fixedly attached to a rear surface of the switchboard. The terminals of the rear connector are connected so that a power source in an input side is connected to the switchboard by a relay side. A protective relay inserted from the front surface of the switchboard is connected to the rear connector through fittings between male and female connecting pieces and fixed to the switchboard side in a locked state. Testing of the protective relay only can be performed by drawing out the relay from the switchboard. Since the rear connector is connected as described above, measurement of relay operation speed, voltage, current and synthetic testing are performed inevitably when the rear connector is disposed at the rear surface of the switchboard.

The rear surface of the switchboard is often crowded with connecting wires, and only a narrow space remains open. In addition, a hot-line portion may be exposed in the narrow space at the rear of the switchboard. Many measuring instruments cannot be used in testing the drawer type plug since care must be taken to the surroundings. Particularly, if a tool is left in the drawer type relay or falls into the relay by mistake, the tool may contact the hot-line portion and cause severe damage such as a short-circuit fault.

Measuring and testing at the rear connector are performed by separately connecting clips to exposed terminals in a grasped state so that proper connection to the testing apparatus results. Accordingly, troublesome work is required, and there is always a fear of electric shock since one's fingers are liable to contact the hot-line portion.

A plug used in the terminal apparatus comprises multiple poles assembled in one body. There are two types of plugs, a test plug used in testing and a connecting plug used in a non-testing state, i.e., during apparatus driving.

Inserting the connecting plug in a bundle results in connection of a circuit in the switchboard side with a circuit in the relay side so that driving is started. If the apparatus required for testing is previously connected to the test plug which is inserted into the terminal apparatus in the bundle, testing can be performed simultaneously at multiple poles.

Any plug can be operated at the front surface of the switchboard as described above; therefore, its operation is performed easily with safety, and the measuring and testing are simplified by simultaneous working of multiple poles.

At present, it is difficult to design and install such a terminal apparatus for the horizontal drawer type relay case because assembling the multiple poles prevents the terminal apparatus from being adequately compact.

The testing apparatus is connected to a test plug, and two lead-in terminals per pole are required to branch the circuit to the relay side and to the switchboard side. Since a tightening tool is likely to be lost, the lead-in terminals are provided with a knob which can be rotatably tightened using one's fingers so that the use of the tightening tool within the switchboard can be avoided. In order to rotatably tighten the knob using one's fingers, the size of the knob must be considerably large. Since the test plug is formed arranging multiple poles in a line, the alignment distance becomes large as the number of poles increases. Furthermore, since many parts such as terminals and knobs are required which necessarily occupy a considerably large area, the testing apparatus cannot be made compact. Particularly in the horizontal relay type case containing stationary elements, many elements are enclosed in one case, and, therefore, the number of poles is numerous and further increases the size of the terminal apparatus.

For example, in the prior art, if a protective relay apparatus composed of three vertical type cases has three stationary elements, the equivalent function of one horizontal type case requires three print cards and three transformers enclosed within it. In this example, there are at least 20 poles in the horizontal type case for the test plug. In addition, the number of terminals and knobs is double the above number. Therefore, 40 sets of terminals and knobs are required.

The area occupied by the terminal apparatus in the horizontal type case is rather small. Since print cards extending in the vertical direction are arranged side by side and enclosed within the case, the width of the terminal apparatus is also small, and the size of the structure to be enclosed adjacent the print cards is also small. Accordingly, the alignment distance between multiple poles in the test plug for the terminal apparatus must be enclosed within the extending height of the print card.

It is difficult to form a test plug having electrode plates for the multiple poles, terminals and knobs within such a restricted area, the number of terminals and knobs being twice that of the number of poles. Therefore, the above-described terminal apparatus is not installed in the horizontal type case, and the rear connector is used in place of the terminal apparatus.

This condition also applies to a terminal apparatus in the conventional vertical type case. That is, the number of the electrode plates for the multiple poles, and the number of terminals and knobs, present problems. In order to reduce the area occupied by the terminals and knobs which are generally used, double knobs in piggy-back relation are effective. This method is intended to reduce the number of knobs by half by solid overlaying and to reduce the area occupied by the knobs on the baseboard.

In this method, both piggy-back knobs have different thread diameters for tightening. The smaller knob, with the smaller thread diameter, can be tightly clamped. However, since the larger knob, with the larger thread diameter, has a small height and also a low number of threads, this latter knob is likely to be loosened. Also, two types of connecting pieces, a larger one and a smaller one having different thread diameters, are required to connect between terminals. Proper use of both types of connecting pieces is troublesome.

The lead wire connected to the testing apparatus during testing is provided with a so-called arrow-shaped chip at its top end. Since the arrow-shaped chip is likely to be readily detached due to loosening at the terminal portion, a larger length lead wire may be provided with a terminal (connecting piece) which has an attaching hole. However, such a connecting piece cannot be inserted before removing both knobs. Also, it is the larger knob which must be connected first, and treatment is, accordingly, inconvenient. The connecting piece for the larger knob is excessively large in size and is likely to be contacted with an adjacent terminal if there is a slight variation in the connecting piece. This is dangerous, particularly when using a connecting piece which has no insulation protection.

Since the electrode plates of the test plug are arranged in a line, the circuit order is distinguished by visual observation. At the knob side connection, however, double knobs in a solid structure are used, and distinguishment of relay side or switchboard side and short-circuit order cannot be determined by visual observation. Therefore, connection is performed in accordance with a mark. In the double knobs having a solid overlaying structure, however, even if the mark is set forth for both knobs, the mark for the larger knob is hidden by the smaller knob and cannot be seen from above. Accordingly, two different marks are set forth for each position of the baseboard on which knobs are mounted, and the mark corresponding to the larger knob cannot be distinguished by visual observation. Since the mark may be hidden by the lead wire after connection, inconvenience occurs when the connection is checked.

The alignment distance between electrode plates of multiple poles is large. Therefore, forming the baseboard as one body and applying the electrode plates to the baseboard is frequently used to achieve greater strength. However, a long, one-body baseboard may be warped or distorted by contraction or by aging of the resin which forms a part thereof. If the baseboard is warped, an abnormal condition occurs in the contacting state of the electrode plates which are used as contacts during the test plug insertion. Thus, not only a poor contacting state occurs, but, also, smooth inserting or detaching action of the test plug is obstructed.

In order to reduce the alignment distance, the wideth of the electrode plate may be decreased. However, potential transformer circuits (hereinafter referred to as "PT" circuits), as well as CT circuits, have elements which are required to carry a large current during opening. These large current elements exist in a mixed state in the electrode plate. Accordingly, the width of the electrode plates cannot be decreased significantly from the viewpoint of current capacity. Also, the electric insulation distance between electrode plates is considerably large. Therefore, the alignment distance cannot be reduced significantly and, accordingly, remains large.

Due to all of the above-mentioned conditions, the maximum number of poles in the test plug for the conventional, vertical type case is restricted to 10 poles at present. If more than 10 poles are required, the terminal apparatus is arranged in two stages, that is, 10 poles on an uppermost stage and 10 poles on a lowermost stage of the vertical type case. Testing is thus performed by inserting the test plug for 10 poles to the upper and the lower stages, respectively. Furthermore, in the terminal apparatus of the relay, the power source at the input side is generally closed to a relay element side by inserting the above-mentioned connecting plug into the terminal apparatus, and the power source is opened or disconnected from the relay element side by pulling the plug out of the terminal apparatus. Also, as indicated, the test plug may be used rather than the connecting plug when it is desired to conduct various kinds of measurements and tests.

Since the terminal apparatus closes or opens an electric path between the power source and the relay element side by inserting or removing a plug as described above, the contacting state of the contacts in the terminal apparatus is very important. Particularly, in a CT circuit, if the CT secondary side is opened completely for only a brief moment, a serious electric fault occurs. Therefore, the CT secondary side cannot be allowed to open even for a moment. Furthermore, the CT circuit cannot be allowed to open even during a transient state while the connecting or the test plug is being inserted or removed when contacts within the terminal apparatus and the contacts on the plug bounce. Moreover, short-circuit closing contacts of the CT secondary side or circuit must be opened after completely connecting the current element of the relay side to the relay circuit. Also, the CT secondary side must be short-circuited before opening the current element at the relay side. Such conditions must be automatically achieved in the contact mechanism of the terminal apparatus during the insertion and removal of the plug. Since the terminal apparatus has both CT circuits and PT circuits in a mixed state, a control mechanism to facilitate the installation and rearrangement of both circuits is desirable for both workability and circuit change.

Since such a terminal apparatus is installed within the relay and the relay elements occupy a large area, a compact terminal apparatus is inevitably desired. The terminal apparatus is enclosed in the relay and is hidden by a housing of the relay; therefore, the electric contact mechanism is completely invisible from outside. If the contacting state of the CT secondary side can be inspected visually from outside the terminal apparatus, the CT circuit can be readily prevented from opening, which, as mentioned above, is very important.

However, in a conventional terminal apparatus, when the terminal apparatus is enclosed within the relay, the internal electric contact mechanism is hidden by the casing of the relay, although an aperture for inserting a plug may be seen from the front surface of the relay. In order to inspect the contacting state of the short-circuit closing contacts which prevent the CT secondary side from opening, the terminal apparatus is inspected after being drawn out of the relay. Alternatively, an electric test can be performed without withdrawing the terminal apparatus by using an electric conduction test plug (not shown). Most operators perform overall tests through relay elements but do not take the trouble to inspect the internal electric contact mechanism of the terminal apparatus as part of the relay tests. Accordingly, the conventional terminal apparatus has disadvantages in that a poor contacting state of the short-circuit closing contacts is not found until a serious electric fault occurs.

SUMMARY OF THE INVENTION

In view of the above-mentioned conditions, requirements and disadvantages, one object of the present invention is to provide a terminal apparatus in which an inspection window near a plug inserting port allows for visual inspection of the internal electric contact mechanism from outside the terminal apparatus. Contact pieces form part of the contact mechanism and are visible through the inspection window. The contact pieces are pushed open or closed by inserting or detaching a plug. A short bar is disposed on a free end of the contact pieces and is connected or separated therefrom with a time delay as the plug is inserted or removed. Therefore, a short-circuit state can be easily visually inspected through the inspection window. Also, means are provided for automatically preventing the opening of the CT secondary side while the plug is being inserted or removed, and the power source at the input side is appropriately connected to or separated from the relay side.

A hole required for mounting a short bar is provided in the terminal apparatus as a spare hole in each circuit so that mounting is performed without requiring a mounting screw or the like. Since the CT circuit requires the above-mentioned short bar and the PT circuit does not, changing between the CT circuit and the PT circuit is performed easily and freely. Accordingly, the circuit change and workability of the terminal apparatus are improved and treatment of it is easy.

Another object of the invention is to provide a batch inserting type test plug in which a narrow thickness portion of each electrode plate extends vertically and is arranged perpendicular to a longitudinal axis of a baseboard so that an alignment distance of a plurality of the electrode plates is significantly reduced. The total number of terminals and knobs are divided into halves and distributed on the baseboard, and each baseboard has half of the total number of terminals and knobs so that a compact apparatus is formed. The compact apparatus can be enclosed in a horizontal type case relay, and measuring and testing are performed readily and safely from the front surface of a switchboard. Accordingly, the measuring and testing procedure is simple.

A further object of the invention is to provide a batch inserting type test plug in which the testing of a protective relay can be performed from the front surface of the switchboard without drawing out the protective relay. A number of electrode plates are provided so that measuring and testing multiple poles can be performed at the same time. The connection of a lead wire can be performed simply and securely, and terminals are readily distinguished. The electrode plates are separately formed and can be inserted or detached smoothly without being affected by warping of the baseboard.

The batch inserting type test plug, according to the present invention, is characterized in that the same knob is used in one terminal per point, and terminals are arranged in division on both baseboards. The terminals on one board are divided and connected to the relay side, and the terminals on the other board are connected to the switchboard side, with each terminal corresponding to a respective mark. Since the small thickness portion of each electrode plate of the plug extends vertically, a length of the plug handle is significantly reduced, and the plug is made compact.

BRIEF DESCRIPTION OF THE DRAWINGS

FIG. 5 is a transverse sectional view taken along line V—V in FIG. 3 illustrating a short-circuit state;

FIG. 6 is a transverse sectional view illustrating a shortcircuit opening state;

FIG. 7 is a transverse sectional view taken along line VII—VII in FIG. 1 illustrating a test plug in an inserted state;

FIG. 8 is a front view of a test plug of an embodiment of the invention;

DESCRIPTION OF THE PREFERRED EMBODIMENTS

Figure 1:
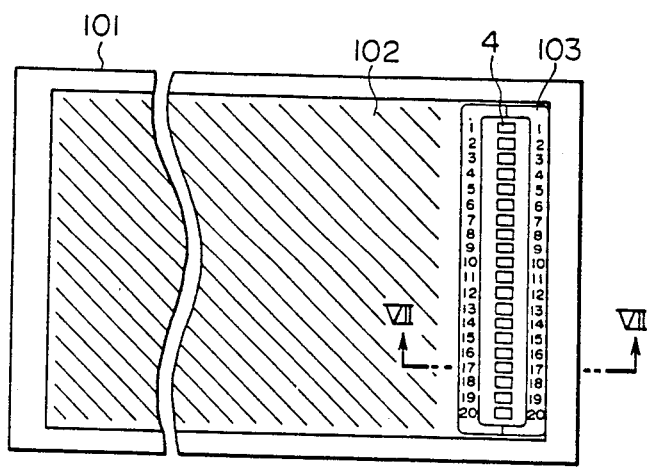
FIGS. 1 and 2 are front views of a horizontal type protective relay and a terminal apparatus for a drawer type relay according to the present invention.
Figure 2:
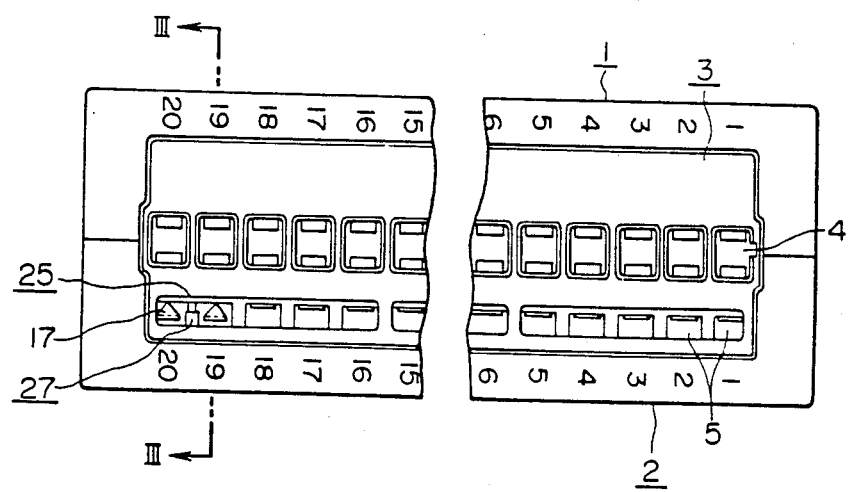

FIGS. 1 and 2 are a front view of a protective relay and a terminal apparatus of a drawer type relay, respectively. The protective relay of FIG. 1 comprises a horizontal case 101; a stationary internal element 102; a terminal apparatus 103 into which a test plug, according to the present invention, is accommodated; and a plug inserting port 4 located on the terminal apparatus 103. In FIG. 2, the terminal apparatus is shown without a relay box, and a relay body has been omitted in this figure.

Referring to FIG. 2, the terminal apparatus comprises an upper side cover 1 and a lower side cover 2, each made of plastic resin and divided to be symmetrically vertical. A front plate 3, made of insulating plastic resin, is provided at the center of the terminal apparatus. The plug inserting port 4 is formed on the front plate 3 for accommodating either a connecting or a testing plug, and an inspection window 5 is also formed on the front plate 3 for visually inspecting a contacting state of contacts.

Figure 3:
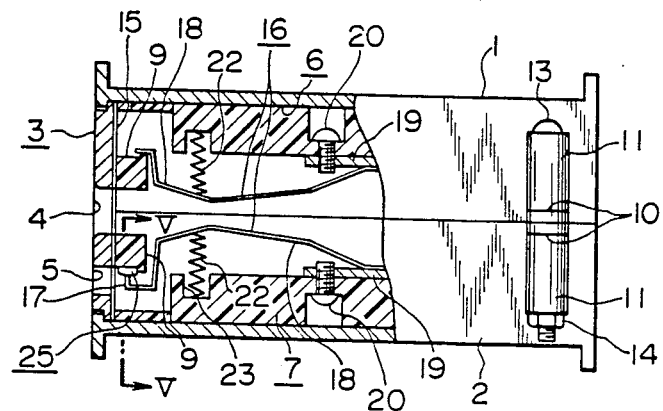
FIG. 3 is a transverse sectional view taken along line III—III in FIG. 2.
Figure 4:
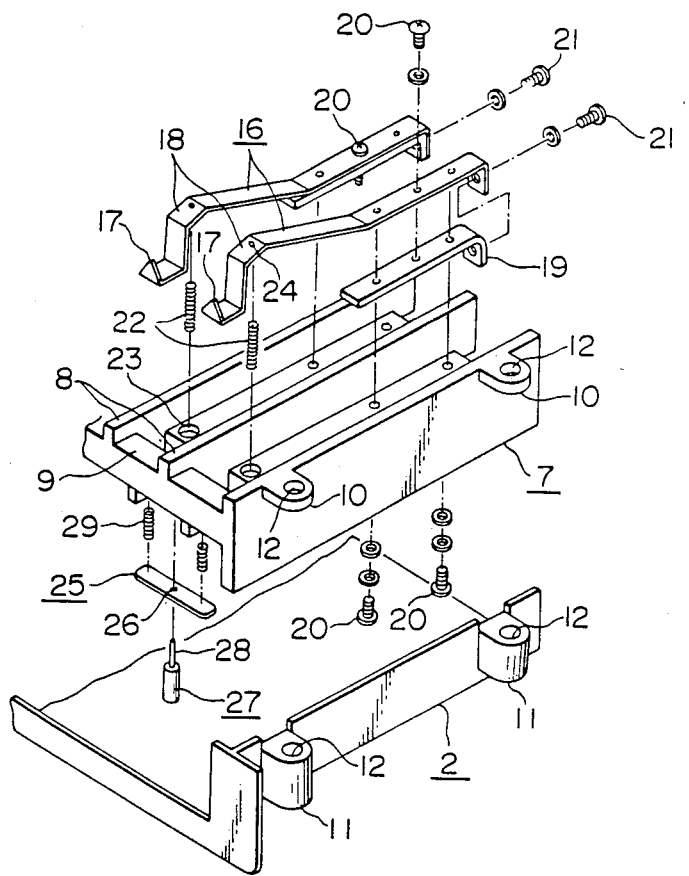
FIG. 4 is an exploded perspective view of a lower portion of the terminal apparatus of FIG. 3 illustrating an electric contact mechanism.

FIG. 3 is a transverse sectional view of the terminal apparatus taken along line III—III in FIG. 2, and FIG. 4 is an exploded perspective view of a lower part of the terminal apparatus illustrating an electric contact mechanism of the terminal apparatus.

An upper terminal board 6 and a lower terminal board 7 are both made of plastic resin and divided vertically in symmetrical form. Each of the terminal boards 6, 7 is provided with a plurality of side walls 8 which provide electric insulation between the poles in each circuit. A stopping board 9 stops a free end 17 of a contact piece 16 as hereinafter described, and a mounting board 10 projects from both side surfaces of each of the terminal boards 6, 7. A mounting leg 11 is provided on the upper cover 1 and the lower cover 2. The upper and lower terminal boards 6, 7, the mounting board 10 and the mounting leg 11 are formed so that a common hole 12 passes through these elements when the upper terminal board 6 is overlaid on the lower terminal board 7. A bolt 13 is inserted through the common hole 12 and tightly clamped with a nut 14 to fix the upper and lower side covers integrally. A transparent plate 15 is fitted to the rear surface of the front plate 3, and this plate is made of transparent resin, such as polycarbonate, to seal the aperture of the inspection window 5. Electric contacts with the window 5 are, therefore, prevented from contamination and are visible from outside.

A contact piece 16 is made of a resilient, conductive plate such as phosphor bronze plate. One end of the contact piece 16 is free and has a U-shaped tip which forms a triangular contact 17 (FIG. 5). The contact piece 16 also has a tapered contact surface near the center of the contact piece 16 to facilitate the plug insertion. The other end of the contact piece 16 is overlaid upon a terminal piece 19 of brass plate and tightly clamped to the upper terminal board 6 and the lower terminal board 7 using a plurality of screws 20. A terminal screw 21 (FIG. 3) connects to a relay element (not shown) through a lead wire (not shown).

A compression spring 22 has one end engaged with a notch 23 on the lower terminal board 7 and the other end engaged with an embossment 24 on the contact piece 16, and this compression spring normally urges the contact piece 16 upwards.

A short bar 25, made of brass plate, has a hole 26 (FIG. 4) at the center. An insulation rod 27 has an upper center shaft portion 28 which is thinner than a lower shaft portion of the rod 27. The upper center shaft portion 28 is inserted in a loose state in the hole 26 at the center of the short bar 25. Another compression spring 29 has one end supported by the lower terminal board 7, and the other end pushes the short bar 25.

FIG. 5 is a transverse, sectional view taken along line V—V in FIG. 3. As shown in FIG. 5, the center shaft portion 28 of the insulation rod 27 is inserted and fixed to the hole 26 of the short bar 25, and the triangular contact 17 of the contact piece 16 rides on the short bar 25. Since the biasing strength of the contact piece 16 is stronger than the biasing strength of the compession spring 29, the short bar 25 is pushed upward by the contact piece 16 and stopped in a contacting state at the stopping board 9. The center shaft portion of the insulation rod 27 is fitted in a hole 30 on the lower terminal board 7, and the other end of the rod 27 contacts the lower side cover 2. Therefore, the rod 27 is held stably without pulling.

FIG. 6 illustrates a state of the short bar when the biasing strength of the contact piece 16 is released from the state shown in FIG. 5. The short bar 25 is lowered by the compression spring 29 and stopped at the junction where the center shaft portion 28 extends from the insulation rod 27. FIG. 5 illustrates a shortcircuit state of the CT secondary side, and FIG. 6 illustrates a shortcircuit opening state of the CT secondary side.

FIG. 7 is a transverse, sectional view taken along line VII—VII of FIG. 1, illustrating an inserted state of the test plug of the present invention. As can be seen in FIG. 7, the external terminal, made of brass plate, is fixed on the lower terminal board 7 and connected to a power source at the input side. Another external terminal 19 is fixed on the upper terminal board 6 and is connected to a protective relay element side. Each of the external terminals 19 is connected to the contact piece 16, which is made of phosphor bronze plate. An outer frame 114 encloses the lower terminal board 7 and the upper terminal board 6, which are symmetrically vertically divided, and the frame 114 also encloses the outer circumference of the front plate 3. The terminal apparatus 103 is clamped tightly using a clamping screw (not shown).

Figure 9:
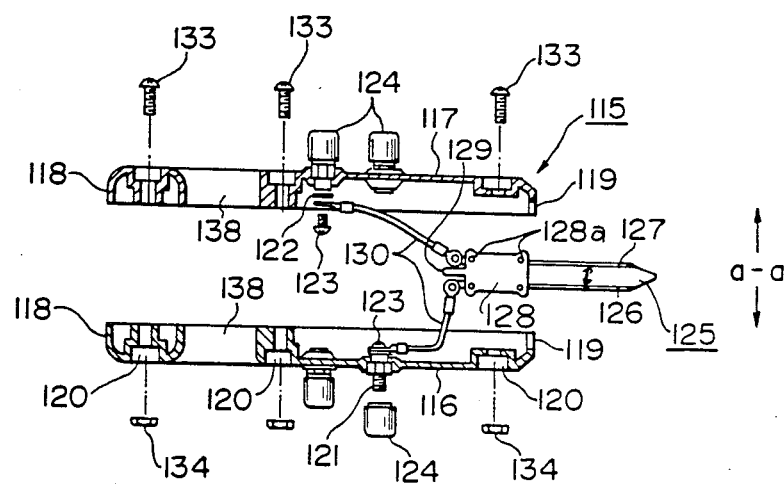
FIG. 9 is a transverse sectional view taken along line IX—IX in FIG. 8.

FIG. 8 is a front view of one embodiment of a test plug 115 of the present invention, and FIG. 9 is a transverse, sectional view taken along line IX—IX of FIG. 8, illustrating the test plug in a vertically divided state.

The test plug 115, according to the present invention, comprises a lower and an upper base 117, and each board 116 is made of an elastic, plastic resin. The lower and upper baseboards 116, 117 are vertically symetrically formed, and both the baseboards 116, 117 have a thin outer circumference and a hollow inner space. A handle 118 can be gripped by an operator for operating the test plug 115. A notch 119 engages an outer circumference of an electrode plate 125, as hereinafter described, and a clamping washer 120 is also provided.

The electrode plate 125 of the plug 115 is constructed so that a small thickness portion of the plug, along the direction of the arrow a—a in FIG. 9, is perpendicular to the longitudinal direction of the handle 118 shown by the arrow b—b in FIG. 8. Thus, the length of the handle 118 is significantly reduced, and, accordingly, the handle and the terminal apparatus can be made compact. In the prior art, since the width of the electrode plate 31 in the direction of the arrow a—a is aligned along the longitudinal direction b—b of the handle 118, the length of the handle becomes excessively long, and the handle becomes unduly large. Therefore, the terminal apparatus accommodating the handle is also required to be large.

A terminal 121, comprising a stepped bolt, is inserted in the clamping washer 120, and the stepped portion of the bolt is engaged with a hexagonal outer circumference of the clamping washer 120 to obstruct lateral rotation. At a rear surface of the stepped bolt, a washer 122 is provided to obstruct any disconnection. A clamping screw 123 of the washer 122 also serves to connect a lead wire as hereinafter described, with the terminal 121. A knob 124, made of plastic resin with an outer circumference knurled, has a metal body which is embedded during molding and provided with a thread portion to be screwed to the terminal 121.

Figure 11:
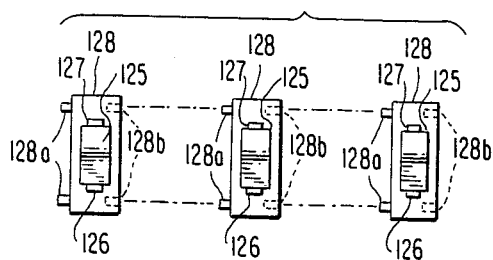
FIG. 11 is an exploded elevational view showing means to align electrode plates of the plug of FIG. 9.

The above-mentioned electrode plate 125 is made by plastic molding, and conductive plates 126, 127, each having a partly exposed thickness portion, are embedded in upper and lower sides of the electrode plate 125 during molding so that they form one body. As shown in FIG. 11, a connecting member 128 has a projection 128a at one side, and, at the other side, a hole 128b is engaged with another projection so that, when a plurality of the individual electrode plates 125 are arranged in a line, adjacent projections and holes are engaged with each other, and the connecting members are aligned. A separating plate 129 is disposed between lead wires 130, which are flexible and can be bent freely. The conductive plate 126 is connected to a group of the terminals 121 which are attached to the side of the lower baseboard 116, and the conductive plate 127 is connected to a group of the terminals 121 which are attached to the side of the upper baseboard 117, respectively, in conformity with an arrangement order of the electrode plates 125. A mark label 131 designates the arrangement order of the electrode plates 125 in numerical notation, and one mark per one terminal is set forth near the terminal 121.

A circuit nameplate 132 indicates the destination of a circuit in a switchboard side or a relay side. The group of the terminals 121, attached to the side of the lower baseboard 116, is shown as the switchboard side, and the group of the terminals 121 attached to the side of the upper baseboard 117, is shown as the relay side. A screw 133 clamps the electrode plate 125. Starting from the state of FIG. 9, the electrode plate 125 is fitted in the notch 119 on the lower baseboard 116 and the upper baseboard 117 to contact the upper and lower boards 116, 117 closely. The screw 133 then tightly clamps the electrode plate 125 through a nut 134 to fix the electrode plate 125 integrally with both boards 116, 117.

The electric path formed by inserting the test plus 115, as described above, into the terminal apparatus 103 is set forth below. The power source at the input side is connected to the terminal 121 of the lower baseboard 116 through the contact piece 16 of the external terminal 19, the conductive plate 126 of the electrode plate 125, and the lead wire 130. The path to the output side is connected to the external terminal 19 through the terminal 121 of the upper baseboard 117, the lead wire 130, the conductive plate 127 of the electrode plate 125, and the contact piece 16. That is, the terminal 121 at the side of the lower baseboard 116 is connected to the power source at the input side, and the terminal 121 at the side of the upper baseboard 117 is connected to the output side. Accordingly, if a testing apparatus is connected between the terminals 121 on both boards 116, 117, an electric path passes through the testing apparatus.

As previously mentioned, the mark labels 131 (FIG. 8) indicate the arrangement order of the terminals 121 of the lower baseboard 116 and the terminals 121 of the upper baseboard 117, in conformity with the arrangement order of the electrode plates 125. The mark labels 131 are applied to both the lower base board 116 and the upper baseboard 117. Lead-in of circuits is distinguished so that circuits having the same mark can be connected in combination. The circuit nameplate 132 is applied to indicate a destination of the circuit when it is led in. A group of the terminals 121 of the lower baseboard 116 is indicated in the switchboard side, and the group of the terminals 121 of the upper baseboard 117 is indicated in the relay side.

Figure 10:
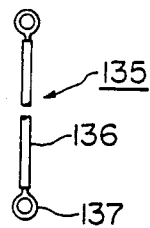
FIG. 10 is a plan view of a connecting piece to connect terminals of the plug of FIG. 9.

FIG. 10 is a plan view of a connecting piece 135 to connect between terminals. The connecting piece 135 comprises a resilient lead wire 136 which can be bent freely. Terminal pieces 137 are provided with a hole for insertion into the terminals 121 and are attached to both ends of the lead wire 136 by caulking.

The connecting piece 135 is attached by removing the knob 124, inserting the terminal piece 137 of the connecting piece 135 to the terminal 121, and clamping the terminal piece 137 tightly. Since fine thread is used in the thread portion of the terminal 121 and an axial length of the thread portion is large, the connecting piece 135 can be clamped tightly. Connection for short circuit is effected using one type of lead wire 136 for connection, between either opposite polarity or the same polarity, since the length of the lead wire 136 is suited for both cases. In connection for the same polarity, the lead wire 136 is bent and stretched between the lower baseboard 116 and the upper baseboard 117. The paths between both of the boards then extend in three directions—through both lateral surfaces of the test plug 115 and a space 138 adjacent the handle 118. Connection is performed through any path which is the shortest of the three.

After a measuring instrument and the testing apparatus are arranged, and the short-circuit connection or same polarity connection is effected in other circuits so as not to obstruct the operation, the test plug 115 is inserted in a bundle so that testing in multiple poles can be performed simultaneously. In the embodiment shown, testing of 20 poles can be performed simultaneously.

When testing is not performed, the external terminal 19 is connected to the other external terminal 19 by inserting the connecting plug (not shown) having a conductive plate inserting portion so that machines are driven.

Since a batch inserting type test plug, according to the present invention, is constructed as described above, and the knobs 124 are arranged in a zigzag form from the right in an order corresponding to a circuit order of the electrode plates 125, an arrangement in extension of a line from the electrode plate 125 facilitates decision of circuit order in comparison to conventional double knobs where arrangement order cannot be decided by intuition.

The connecting relation between a plurality of the electrode plates 125 and the knobs 124 thus can be easily distinguished. Connection to the relay side or the switchboard side is also distinguished clearly since the lower baseboard 116 is connected to the switchboard side, and the upper baseboard 117 is connected to the relay side. Furthermore, correspondence of one mark to one terminal makes distinguishment easy and convenient at wiring and checking, in comparison with terminal mark indication in conventional combination terminals where two marks are set forth together.

The knobs 124 are unified in dimension and arranged alternately in a zigzag form. The small diameter thread portion of the knobs 24 permits the knobs to be well clamped. Particularly, in the threads of the terminal 121, a fine thread diameter is used which prevents loosening after clamping, in comparison with normal threads. Unification of thread diameter results in unification of the connecting piece 135 having the terminal piece 137 and the lead wire 136, used in connection of both opposite polarity and same polarity. This improves workability and produces advantages in manufacturing.

If a protective relay installed at the upper portion of a switchboard is tested, a long lead wire is required, and a terminal other than an arrow-shaped chip may be used as a connecting piece. In this case, any terminal can be connected by removing one of the knobs 124 and re-screwing it again. Therefore, the troublesome work of removing two knobs, as seen in double-type knob constructions, is eliminated. Since the distance between the terminals 121 is widened due to the zigzag arrangement, and the metal portion of the knob 124 as well as the terminal piece 137 is hidden and protected by the outer circumference of the knob 124 after the knob 124 is tightened, any possible contact between adjacent bare connecting pieces is prevented securely. Therefore, safety of treatment is guaranteed, even when the connecting piece 135, which has no insulation protection, is connected to the terminal 121. Since the knob 124 is singular, and the pitch is widened in comparison with a double-type knob, the singular knob is readily held by one's fingers.

The conductive plates 126 and 127 each have a small thickness in the vertical direction and are integrally embedded during a plastic molding process. Therefore, the width of the electrode plate 125 arrangement is reduced. The distance required for electric insulation between adjacent electrode plates 125 is obtained by providing a small space between the plates 125 so that the electrode plates 125 are separated from each other, and a creeping distance is insulated sufficiently. Accordingly, when a number of the electrode plates 125 are arranged as shown in FIG. 8 (20 poles are shown), the arrangement distance in a line is significantly reduced, and multiple poles can be formed compactly and enclosed in a horizontal type case.

In the prior art, a conductive plate is applied on a plastic baseboard as one body so that the width of each electrode plate becomes large, and the creeping distance required for insulation between the electrode plates becomes considerably large. Accordingly, the arrangement distance increases. Therefore, it is difficult to enclose multiple poles compactly in a horizontal type case, and this has thus far prevented multiple poles from being enclosed in a horizontal type case.

The conventional plastic baseboard incorporated into one body has disadvantages in that contraction or aging of the resin may give rise to strain or distortion, thus resulting in a poor contacting state of the electrode plates. Also, the inserting or detaching action of the prior art, one body test plug is not performed smoothly. To the contrary, the electrode plate 125 of the present invention is formed individually, is small in width, and is made of resin so that little contraction occurs. Therefore, the strain caused by contraction does not result. The electrode plates 125 are each provided with the connecting members 128 and fitted together in a line. The lower baseboard 116 and the upper baseboard 117, which hold the electrode plates 125, are made of resilient plastic resin, and the interior of both boards 116, 117 is hollow. Therefore, when contraction of the resin gives rise to strain, the resin is warped on the external surface, but not on the internal surface having the least thickness. If the electrode plate 125 is engaged with the notches 119 and tightly clamped by the screw 133, since the resin has limited thickness and is resilient, the outward strain is mutually modified corresponding to clamping, and both boards are integrated. The lower baseboard 116 and the upper baseboard 117, which are integrated as described above, are mutually opposed outwards at equal strength and are always held in a line. Moreover, fitting of the connecting members 128 holds alignment; therefore, contraction of the resin still does not give rise to bending in alignment with multiple poles. Since the contact piece 16 is contacted with the small thickness portion of the conductive plates 26 and 27, contact resistance is small in comparison to surface contact in conventional wide electrode plates, and smooth operation is permitted.

The terminals 121 and the knobs 124 are distributed in equal number on parts of the lower baseboard 116 and the upper baseboard 117, and, therefore, the occupied area on each board is reduced by half. In the prior art, the terminals and knobs are distributed on one baseboard, and the number of parts to be mounted is restricted; therefore, the solid overlaying structure, such as double knobs, is used in order to reduce the occupied area.

As described above, multiple poles are assembled compactly and enclosed within the horizontal type case 101 shown in FIG. 1. The test plug 115 is inserted from the front surface of the board for testing, as shown in FIG. 7, without drawing out the protective relay, as is done in the prior art. Thus, troublesome work for drawing-out is omitted. In testing, it is not necessary to attach clips individually with rear connectors as in the prior art. Inserting the test plug 115 in a bundle with previously connected testing apparatuses enables simultaneous testing of multiple poles. Thus, treatment is simplified, and safety is guaranteed.

The test plug 115 also can be used in a vertical type case, and, in the prior art, testing of multiple poles using two sets of 10 poles can be performed using one set. Accordingly, in the present invention, use of the test plug is simple, and the occupied area of the relay case can be reduced.

The function of the terminal apparatus will now be described.

The electric path of the terminal apparatus is set forth below. If the electrode plate 125 of the plug 115 is inserted in the plug inserting port 4, the contact surface 18 of the contact piece 16 on the upper terminal board 6 and the lower terminal board 7, shown in FIG. 3, is pushed open and contacts the electrode plate 125. Current at the input side, which is connected to the terminal piece 19 of the lower terminal board 7, flows to relay elements at the relay side which are connected to the terminal piece 19 of the upper terminal board 6.

When the plug 115 is inserted in the short-circuit state of the CT secondary side, as shown in FIG. 3, the triangular contact 17 of the free end of the contact piece 16 is guided by the tapered contact surface 18 and pushed open gradually as the plug 115 travels inward into the terminal apparatus. Even though the biasing force of the triangular contact 17 against the short bar 25 is released, the CT secondary side does not open since the compression spring 29 lowers the short bar 25 and keeps the short bar in contact with the triangular contact 17. The short-circuit state of the CT secondary side is held until the short bar 25 moves downward, and it is stopped at the junction where the center shaft portion 28 extends from the insulation rod 27 while the triangular contact 17 continues to move downward. While the short-circuit state is held, the input side and the relay side are electrically connected through the electrode plate 125 of the plug 115, and the CT secondary side is short-circuited so that an electric path is formed in a mixed state. Therefore, the CT secondary side is not allowed to open, even during the transient state when the plug is being inserted or removed. If the plug 115 is further inserted from the stop state of the short bar 25, the triangular contact 17 is caused to be disengaged from the short bar 25, as shown in FIG. 6, with the result that the CT secondary side is opened. As is readily evident, the above-described short-circuit action also occurs during the plug 115 detaching operation, although it occurs in a reverse sequence.

In other words, as the plug is inserted to form an electric path between the input side and the relay side, the short circuit of the CT secondary side must be opened after the current elements at the relay side are completely connected to the input side. In addition, the CT secondary side must be short-circuited before the current elements at the relay side are completely opened, or electrically disengaged from the input side, as the plug 115 is removed.

In addition, by removing the short bar 25, the compression spring 29 and the insulation rod 27, a PT circuit, rather than a CT circuit, can be readily formed. If the above-mentioned parts are added in the assembling sequence in FIG. 3, a PT circuit can be easily changed into a CT circuit. The lower terminal board 7 is provided with the hole 30 for inserting the center shaft 27, and a mounting hole for the compression spring 29 is provided so that the short-circuit parts can be installed to any circuit. Changing a PT circuit to a CT circuit, and vice versa, is, therefore, simple, and the treatment thereof is convenient.

Although the figures illustrate a short circuit at two poles, if three or four poles are required, it is clear from the figures that the length of the short bar can be extended to attain a short circuit for any number of multiple poles.

Regarding the inspection window 5, the contacting state of the short bar 25 and the triangular contact 17 are visible from outside the window 5 through the transparent plate 15.

FIG. 5 illustrates the short-circuit state of the CT secondary side, and FIG. 6 illustrates the short-circuit opening state of the CT secondary side. As is clearly seen from the figures, if the triangular contact 17 contacts the short bar 25, the short circuit is completed. If the triangular contact 17 is disconnected from the short bar 25, the short circuit is opened. Discrimination is easy and convenient for inspection.

Although, in the figures, the tip of the free end of the contacting piece 16 is bent so that the triangular contact 17 is formed, it is easy to form the contact 17 in semi-circular form. If desired, twin contacts, composed of two triangular projections, can be easily made for improving the contacting short-circuit condition.

Since the inspection window 5 is arranged in a position which is visible even when the plug 115 is inserted in the terminal apparatus, the contacting state of the short bar 25 and the triangular contact 17 can be discerned even when the plug 115 is being inserted or removed. At inspection for shipment or acceptance, a conventional electric test thus is not necessary; rather, a visual inspection of the contacting state or performance state can be conducted, and treatment is convenient.

Although discrimination between the PT and the CT circuit enclosed in the relay case is not easy in the conventional terminal apparatus, visual inspection from outside through the inspection window 5 of the terminal apparatus of the present invention enables easy discrimination because the appearance of the short bar 25 represents a CT circuit, and the non-appearance of the short bar 25 represents a PT circuit. In the conventional terminal apparatus, disassembling of the terminal apparatus is required to make such a check.

Regarding tests during operation in the prior art terminal apparatus, a poor contacting state of the short-circuiting contacts in the CT circuit is not found before an electric fault is produced and before the terminal apparatus is checked by disassembling. The present invention eliminates such troublesome work since a visual inspection from outside the terminal apparatus through the inspection window 5 enables an easy check of the contacting state of the short-circuiting contacts. Therefore, inspection is easy and has the effect of preventing a serious fault caused by an opening of the CT secondary circuit.

Although, in the present invention, the triangular contact 17 is commonly used in PT and CT circuits for easy circuit changes, in order to make discrimination easy, it is possible to use the triangular contact 17 shown in FIG. 1 only in the CT circuit and not in the PT circuit.

We claim:

1. A batch inserting type test plug comprising:
  a plurality of individual electrode plates each having one conduction plate embedded in plastic resin on opposite top and bottom surfaces of each of said electrode plates,
  connecting members for overlaying and connecting said plurality of said electrode plates in a line;
  an upper resilient baseboard made of plastic resin and having a hollow interior space for holding said connected electrode plates;
  a lower resilient baseboard for fixing said connected electrode plates with said upper baseboard;
  a group of first and second terminals arranged on said upper and lower baseboards, respectively, and being electrically connected to a relay side and a switchboard side, respectively, said first and second terminals being arranged in a zigzag pattern corresponding to an arrangement order of said electrode plates;
  a plurality of knobs screwed into said first and second terminals; and
  connecting pieces connected to said first and second terminals in a freely bent state.

2. The test plug as claimed in claim 1 wherein said group of first and second terminals comprise a plurality of stepped bolts, and further comprising a plurality of clamping washers having an outer surface formed so as to obstruct lateral rotation of said stepped bolts.

3. The test plug as claimed in claim 1 wherein said plurality of knobs comprise a metal body embedded in a plastic resin an outer circumference of which is knurled and having a thread portion, said knobs being screwed into said first and second terminals.

4. The test plug as claimed in claim 1 wherein each of said connecting members has a projection in one side surface and a hole in an opposite side surface so that adjacent connecting members can be engaged with one another and aligned.

5. The test plug as claimed in claim 1 wherein said connecting pieces comprise a plurality of pairs of flexible lead wires for interconnecting said connecting members and said terminals, and said test plug further comprises a plurality of separation plates for separating said wires.

6. The test plug as claimed in claim 1 wherein each of said connecting pieces comprises a resilient lead wire having first and second holes at opposite ends thereof for insertion into desired ones of said terminals.

7. The test plug as claimed in claim 1 wherein said connecting members connect said plurality of electrode plates adjacent one another in a first direction and wherein the conductive plates of each of said electrode plates are displaced with respect to one another in a second direction and wherein said electrode plates connected in said line are each oriented so that a width line of each of said electrode plates taken in said second direction is perpendicular to said first direction.

8. The test plug as claimed in claim 6 wherein said connecting pieces provide conduction paths in three directions.

9. The test plug as claimed in claim 1, wherein said connecting members connect said plurality of independent electrode plates together in a line with gaps separating adjacent electrode plates along the direction of said line.

* * * * *